United States Patent
Nakajima

(10) Patent No.: US 10,218,317 B2
(45) Date of Patent: Feb. 26, 2019

(54) HIGH-FREQUENCY AMPLIFIER MODULE

(71) Applicant: Murata Manufacturing Co., Ltd., Kyoto (JP)

(72) Inventor: Reiji Nakajima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/682,952

(22) Filed: Aug. 22, 2017

(65) Prior Publication Data
US 2018/0062587 A1  Mar. 1, 2018

(30) Foreign Application Priority Data

Aug. 23, 2016  (JP) .................................. 2016-162376

(51) Int. Cl.
| | | |
|---|---|---|
| H03F 1/30 | (2006.01) | |
| H03F 1/02 | (2006.01) | |
| H03F 1/56 | (2006.01) | |
| H03F 3/19 | (2006.01) | |
| H01L 23/48 | (2006.01) | |
| H03F 3/195 | (2006.01) | |
| H01L 29/417 | (2006.01) | |
| H01L 29/737 | (2006.01) | |

(52) U.S. Cl.
CPC ............ *H03F 1/302* (2013.01); *H01L 23/48* (2013.01); *H03F 1/0205* (2013.01); *H03F 1/0261* (2013.01); *H03F 1/56* (2013.01); *H03F 3/19* (2013.01); *H03F 3/195* (2013.01); *H01L 29/41708* (2013.01); *H01L 29/737* (2013.01); *H03F 2200/222* (2013.01); *H03F 2200/366* (2013.01); *H03F 2200/387* (2013.01)

(58) Field of Classification Search
CPC .................................. H03F 3/195; H03F 3/213
USPC ........................................................ 330/307
See application file for complete search history.

(56) References Cited

U.S. PATENT DOCUMENTS

2010/0117737 A1* 5/2010 Kondo .................. H03F 1/0272
330/276

FOREIGN PATENT DOCUMENTS

| JP | 2001-057511 A | 2/2001 |
|---|---|---|
| JP | 2004-193685 A | 7/2004 |
| JP | 2006-005643 A | 1/2006 |
| JP | 2006-294901 | 10/2006 |

(Continued)

OTHER PUBLICATIONS

Japanese Notice of Rejections for Japanese Application No. 2016-162376 dated Jan. 8, 2019. X.

*Primary Examiner* — Steven J Mottola
(74) *Attorney, Agent, or Firm* — Pearne & Gordon LLP

(57) ABSTRACT

A high-frequency amplifier module includes a semiconductor substrate and an insulating substrate. The semiconductor substrate includes multiple emitter electrodes, each of which is coupled to the emitter of a corresponding one of high-frequency amplifying transistors. The insulating substrate includes a common ground electrode, ground terminal electrodes, and thickness-direction coupling electrodes. The common ground electrode is formed on or near the front surface of the insulating substrate, and is joined to the emitter electrodes. The ground terminal electrodes are formed on the back surface of the insulating substrate. The thickness-direction coupling electrodes couple the common ground electrode to the ground terminal electrodes.

4 Claims, 3 Drawing Sheets

(56) References Cited

FOREIGN PATENT DOCUMENTS

JP    2012-089590 A    5/2012

* cited by examiner

HIGH-FREQUENCY AMPLIFIER MODULE

This application claims priority of Japanese Patent Application No. 2016-162376 filed on Aug. 23, 2016. The content of this application is incorporated herein by reference in its entirety.

BACKGROUND OF THE DISCLOSURE

1. Field of the Disclosure

The present disclosure relates to a high-frequency amplifier module including a semiconductor substrate and an insulating substrate on which the semiconductor substrate is mounted. The semiconductor substrate has high-frequency amplifiers amplifying a high frequency signal.

2. Description of the Related Art

Heretofore, various high-frequency amplifiers have become commercially practical. Some high-frequency amplifiers are used in power amplifiers amplifying transmission signals. For example, a high-frequency power amplifier described in Japanese Unexamined Patent Application Publication No. 2001-57511 is used in such a power amplifier.

The high-frequency power amplifier described in Japanese Unexamined Patent Application Publication No. 2001-57511 includes a heterojunction bipolar transistor (HBT) for amplifying a high frequency signal. The base of the HBT for amplifying a high frequency signal is coupled to a high-frequency signal input terminal through an input matching circuit. The collector of the HBT for amplifying a high frequency signal is coupled to a high-frequency signal output terminal through an output matching circuit. The emitter of the HBT for amplifying a high frequency signal is grounded through an inductor. A base bias is applied to the base of the HBT for amplifying a high frequency signal, and a drive voltage is applied to the collector. The linearity of the HBT for amplifying a high frequency signal is improved by grounding the emitter through the inductor.

However, an HBT for amplifying a high frequency signal which operates with a high amplification factor so as to output a desired high signal level may go beyond the range in which the linearity is possibly improved by using an inductor, resulting in a problem such as the occurrence of distortion harmonics.

Amplification to a high signal level causes an HBT for amplifying a high frequency signal to be heated. Thus, the amplifying characteristics of the HBT for amplifying a high frequency signal may be degraded, resulting in a problem such as the occurrence of distortion harmonics.

BRIEF SUMMARY OF THE DISCLOSURE

Therefore, an object of the present disclosure is to provide a high-frequency amplifier module that hardly suffers characteristics degradation even when a necessary output signal level is high, and that has excellent heat dissipation performance.

A high-frequency amplifier module according to preferred embodiments of the present disclosure includes a semiconductor substrate and an insulating substrate. The semiconductor substrate includes a plurality of high-frequency amplifying transistors. The plurality of high-frequency amplifying transistors amplify a single high frequency signal. The insulating substrate has a front surface and a back surface. The front surface faces the back surface. The semiconductor substrate includes a plurality of emitter electrodes. Each of the plurality of emitter electrodes is coupled to an emitter of a corresponding one of the plurality of high-frequency amplifying transistors. The insulating substrate includes a common ground electrode, a ground terminal electrode, and at least one thickness-direction coupling electrode. The common ground electrode is formed on or near the front surface and is joined to the plurality of emitter electrodes. The ground terminal electrode is formed on the back surface. The at least one thickness-direction coupling electrode couples the common ground electrode to the ground terminal electrode.

In the configuration, the multiple high-frequency amplifying transistors are used to amplify a single high frequency signal. Therefore, while the amplification factors of the individual high-frequency amplifying transistors are reduced, a high amplification factor as a high-frequency amplifier module is achieved. The emitters of the high-frequency amplifying transistors are coupled to the common ground electrode on or near the front surface of the insulating substrate. Therefore, the heat produced by the high-frequency amplifying transistors is easily dissipated by using the common ground electrode. In addition, the at least one thickness-direction coupling electrode is used to implement an inductor for grounding. Therefore, the linearity of the high-frequency amplifying transistors is improved, and the amplifying characteristics as a high-frequency amplifier module are improved.

Preferably, in the high-frequency amplifier module according to the preferred embodiments of the present disclosure, the at least one thickness-direction coupling electrode includes a plurality of thickness-direction coupling electrodes.

In the configuration, the efficiency of the heat transfer to the ground terminal electrode on the back surface of the insulating substrate is improved by providing the plurality of thickness-direction coupling electrodes.

Preferably, in the high-frequency amplifier module according to the preferred embodiments of the present disclosure, the area of each of the plurality of emitter electrodes is larger than the area of a region in which a corresponding one of the plurality of high-frequency amplifying transistors is formed.

In the configuration, the efficiency of heat transfer to the common ground electrode is improved.

The present disclosure achieves a high-frequency amplifier module that hardly suffers characteristics degradation and that has excellent heat dissipation performance.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Figure 1A:
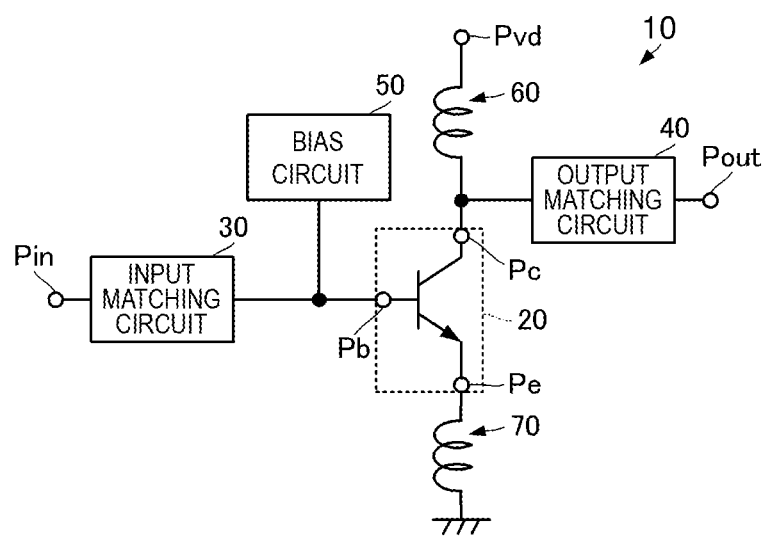
FIG. 1A is a schematic circuit block diagram illustrating a high-frequency amplifier module according to a first embodiment of the present disclosure.
Figure 1B:
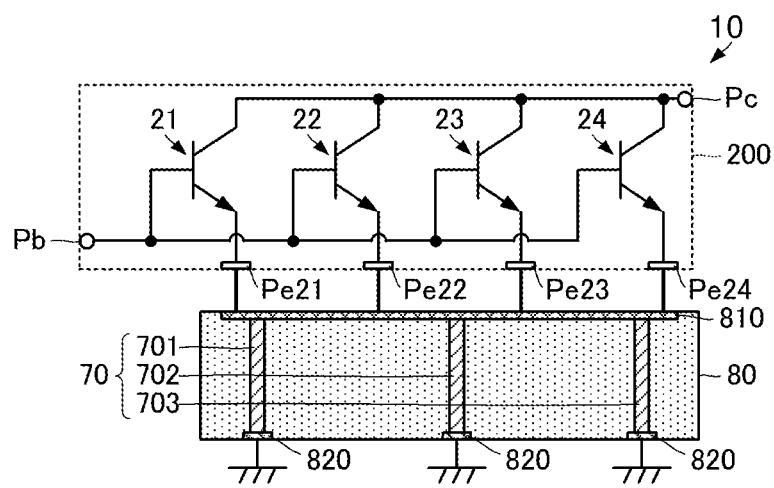
FIG. 1B is a diagram illustrating a schematic configuration of the high-frequency amplifier module according to the first embodiment of the present disclosure.
Figure 2:
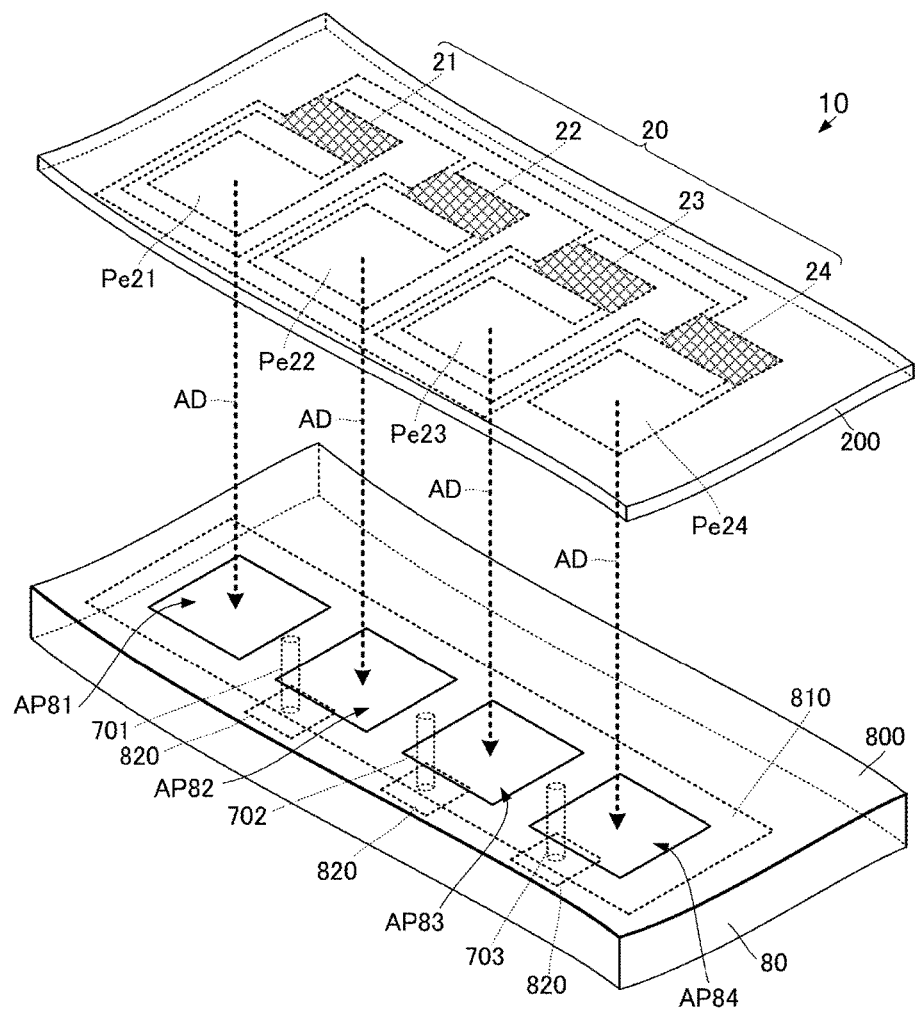
FIG. 2 is a partial external perspective view of a schematic configuration of the high-frequency amplifier module according to the first embodiment of the present disclosure.

A high-frequency amplifier module according to a first embodiment of the present disclosure will be described with reference to the drawings. FIG. 1A is a schematic circuit block diagram illustrating a high-frequency amplifier module according to the first embodiment of the present disclosure. FIG. 1B is a diagram illustrating a schematic configuration of the high-frequency amplifier module according to the first embodiment of the present disclosure. FIG. 2 is a partial external perspective view of a schematic configuration of the high-frequency amplifier module according to the first embodiment of the present disclosure.

As illustrated in FIG. 1A, a high-frequency amplifier module 10 includes a high-frequency amplifying device 20, an input matching circuit 30, an output matching circuit 40, a bias circuit 50, a choke coil 60, and a characteristics adjusting inductor 70. The high-frequency amplifier module 10 also includes a high-frequency signal input terminal Pin, a high-frequency signal output terminal Pout, and a drive-voltage applying terminal Pvd.

The high-frequency amplifying device 20 includes a base terminal Pb, a collector terminal Pc, and an emitter terminal Pe. The base terminal Pb is coupled to the high-frequency signal input terminal Pin through the input matching circuit 30. The base terminal Pb is coupled to the bias circuit 50. The collector terminal Pc is coupled to the drive-voltage applying terminal Pvd through the choke coil 60. The collector terminal Pc is coupled to the high-frequency signal output terminal Pout through the output matching circuit 40. The emitter terminal Pe is coupled to the ground through the characteristics adjusting inductor 70.

A bias voltage Vb is applied from the bias circuit 50, and a drive voltage Vd is applied from the drive-voltage applying terminal Pvd. Thus, the high-frequency amplifying device 20 amplifies a high frequency signal with an amplification factor according to the bias voltage Vb. At that time, the linearity of the high-frequency amplifying device 20 is improved by coupling the characteristics adjusting inductor 70 to the emitter terminal Pe. Thus, the high-frequency amplifying device 20 may amplify a high frequency signal with a desired amplification factor according to the bias voltage Vb while characteristics degradation such as occurrence of nonlinear distortion is reduced.

As illustrated in FIGS. 1B and 2, the high-frequency amplifying device 20 includes high-frequency amplifying transistors 21, 22, 23, and 24. In the first embodiment, the form in which four high-frequency amplifying transistors form the high-frequency amplifying device 20 will be described. However, the number of high-frequency amplifying transistors is not limited to this. Any form may be employed as long as multiple high-frequency amplifying transistors are included.

The bases of the high-frequency amplifying transistors 21, 22, 23, and 24 are coupled to the base terminal Pb. That is, the base terminal Pb is a common terminal of the high-frequency amplifying transistors 21, 22, 23, and 24. The collectors of the high-frequency amplifying transistors 21, 22, 23, and 24 are coupled to the collector terminal Pc. That is, the collector terminal Pc is a common terminal of the high-frequency amplifying transistors 21, 22, 23, and 24.

The emitter of the high-frequency amplifying transistor 21 is coupled to an emitter electrode Pe21. The emitter of the high-frequency amplifying transistor 22 is coupled to an emitter electrode Pe22. The emitter of the high-frequency amplifying transistor 23 is coupled to an emitter electrode Pe23. The emitter of the high-frequency amplifying transistor 24 is coupled to an emitter electrode Pe24.

As illustrated in FIG. 2, the high-frequency amplifying transistors 21, 22, 23, and 24 are formed in or on a semiconductor substrate 200. Each of the high-frequency amplifying transistors 21, 22, 23, and 24 has, for example, a heterojunction bipolar transistor (HBT) configuration.

The emitter electrodes Pe21, Pe22, Pe23, and Pe24 are formed on the back surface of the semiconductor substrate 200. The planar area of each of the emitter electrodes Pe21, Pe22, Pe23, and Pe24 is preferably larger than the area of a region in which a corresponding one of the high-frequency amplifying transistors 21, 22, 23, and 24 is formed. Thus, the heat dissipation effect of each of the high-frequency amplifying transistors 21, 22, 23, and 24 is improved.

The bases of the high-frequency amplifying transistors 21, 22, 23, and 24 are coupled by using a base electrode pattern to which no reference characters are assigned in FIG. 2 and which is formed on the back surface of the semiconductor substrate 200. The base electrode pattern is coupled to an electrode pad (not illustrated) forming the base terminal Pb. The collectors of the high-frequency amplifying transistors 21, 22, 23, and 24 are coupled by using a collector electrode pattern formed on the back surface of the semiconductor substrate 200. The collector electrode pattern is coupled to an electrode pad (not illustrated) forming the collector terminal Pc.

In and on an insulating substrate 80, circuit configuration components other than the high-frequency amplifying device 20 in the high-frequency amplifier module 10 illustrated in FIG. 1A are formed or mounted (not illustrated).

The insulating substrate 80 has a front surface and a back surface which face each other. A common ground electrode 810 is formed on the front surface of the insulating substrate 80. Multiple ground terminal electrodes 820 are formed on the back surface of the insulating substrate 80. The ground terminal electrodes 820 are coupled to the ground through other circuit substrates and the like.

Thickness-direction coupling electrodes 701, 702, and 703 are formed in the insulating substrate 80. The thickness-direction coupling electrodes 701, 702, and 703 couple the common ground electrode 810 to the ground terminal electrodes 820. These thickness-direction coupling electrodes 701, 702, and 703 form the characteristics adjusting inductor 70.

As illustrated in FIG. 2, an insulating resist 800 is disposed on the front surface of the common ground electrode 810. Openings AP81, AP82, AP83, and AP84 are provided on the insulating resist 800. These openings AP81, AP82, AP83, and AP84 cause the regions in which the common ground electrode 810 is exposed, to serve as land electrodes to which the emitter electrodes Pe21, Pe22, Pe23, and Pe24 are joined.

The region in which the common ground electrode 810 is exposed through the opening AP81 is coupled to the emitter electrode Pe21 by using a conductive bonding material AD. The region in which the common ground electrode 810 is exposed through the opening AP82 is joined to the emitter electrode Pe22 by using the conductive bonding material AD. The region in which the common ground electrode 810 is exposed through the opening AP83 is joined to the emitter electrode Pe23 by using the conductive bonding material AD. The region in which the common ground electrode 810 is exposed through the opening AP84 is joined to the emitter electrode Pe24 by using the conductive bonding material AD. The conductive bonding material AD is, for example, solder. Solder bumps formed on the outer surfaces of the emitter electrodes Pe21, Pe22, Pe23, and Pe24 may be used. The conductive bonding material AD is preferably a material having a high thermal conductivity.

In such a configuration, the output from the high-frequency amplifying device 20 is obtained by combining the outputs from the high-frequency amplifying transistors 21, 22, 23, and 24 together. Thus, even if the output level as the high-frequency amplifying device 20 is made high, the amplification factor for each of the high-frequency amplifying transistors 21, 22, 23, and 24 may be reduced. Thus, heat from the high-frequency amplifying transistors 21, 22, 23, and 24 may be reduced, and characteristics degradation of the high-frequency amplifying transistors 21, 22, 23, and 24 which is produced due to heat may be reduced. In addition, the linearity of the high-frequency amplifying transistors 21, 22, 23, and 24 is easily maintained.

In the configuration according to the first embodiment, the emitter Pe21, Pe22, Pe23, and Pe24 of the high-frequency amplifying transistors 21, 22, 23, and 24 are joined to the common ground electrode 810 only through the conductive bonding material. In addition, the area of the common ground electrode 810 is larger than the area of each of the emitter electrodes Pe21, Pe22, Pe23, and Pe24 and the ground terminal electrodes 820, and is disposed on the front surface of the insulating substrate 80. Thus, the common ground electrode 810 effectively dissipates heat produced by the high-frequency amplifying transistors 21, 22, 23, and 24, to the outside through the emitter electrodes Pe21, Pe22, Pe23, and Pe24. Thus, characteristics degradation of the high-frequency amplifying transistors 21, 22, 23, and 24 which is produced due to heat may be further reduced.

In the configuration according to the first embodiment, the common ground electrode 810 is coupled to the ground terminal electrodes 820 by using the thickness-direction coupling electrodes 701, 702, and 703. Thus, compared with a case of a single thickness-direction coupling electrode, the heat dissipation effect may be improved.

The number and thickness of the thickness-direction coupling electrodes may be appropriately determined in accordance with an inductance that is to be achieved by using the characteristics adjusting inductor 70. Thus, a desired inductance as the characteristics adjusting inductor 70 may be achieved, which improves the linearity of the high-frequency amplifying device 20.

In the above-described configuration, the insulating resist 800 is not necessarily included. In this case, the regions corresponding to the openings AP81, AP82, AP83, and AP84 on the common ground electrode 810 serve as land electrodes.

Figure 3:
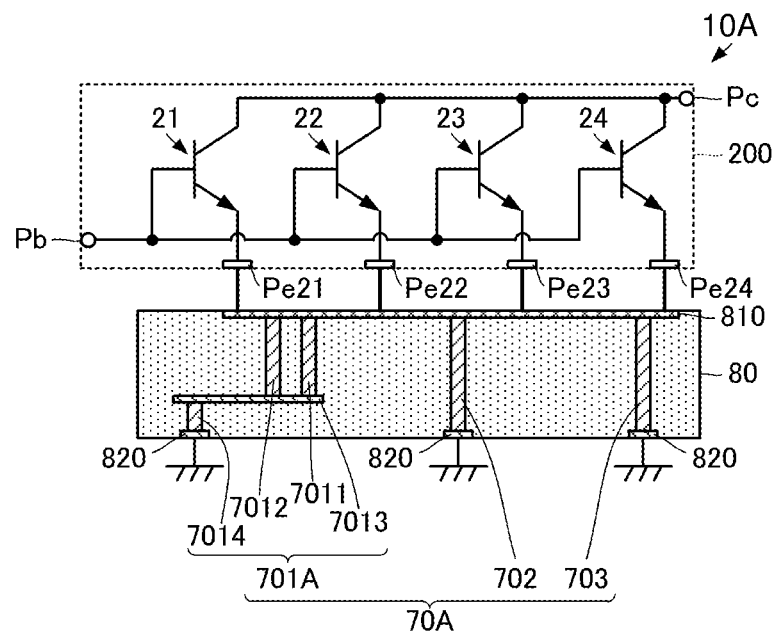
FIG. 3 is a diagram illustrating a schematic configuration of a high-frequency amplifier module according to a second embodiment of the present disclosure.

A high-frequency amplifier module according to a second embodiment of the present disclosure will be described with reference to the drawing. FIG. 3 is a diagram illustrating a schematic configuration of the high-frequency amplifier module according to the second embodiment of the present disclosure.

A high-frequency amplifier module 10A according to the second embodiment is different from the high-frequency amplifier module 10 according to the first embodiment in the configuration in which the common ground electrode 810 is coupled to the ground terminal electrodes 820. The other configuration of the high-frequency amplifier module 10A is substantially the same as that of the high-frequency amplifier module 10, and portions that are substantially the same will not be described.

The insulating substrate 80 includes the common ground electrode 810, the multiple ground terminal electrodes 820, and thickness-direction coupling electrodes 701A, 702, and 703. A characteristics adjusting inductor 70A includes the thickness-direction coupling electrodes 701A, 702, and 703. The common ground electrode 810, the multiple ground terminal electrodes 820, and the thickness-direction coupling electrodes 702 and 703 have substantially the same configuration as those in the first embodiment.

The thickness-direction coupling electrode 701A includes thickness-direction coupling electrodes 7011, 7012, and 7014 and a routing electrode 7013. The routing electrode 7013 is disposed at a certain position in the thickness direction of the insulating substrate 80. The routing electrode 7013 extends in the direction orthogonal to the thickness direction of the insulating substrate 80.

The thickness-direction coupling electrodes 7011 and 7012 couple the common ground electrode 810 to the routing electrode 7013. The thickness-direction coupling electrode 7014 couples the routing electrode 7013 to a ground terminal electrode 820.

Such a configuration enables the mode in which the common ground electrode 810 is coupled to the ground terminal electrodes 820, to be adjusted. That is, the inductance of the characteristics adjusting inductor 70A may be adjusted. Thus, the linearity is easily improved.

Figure 4:
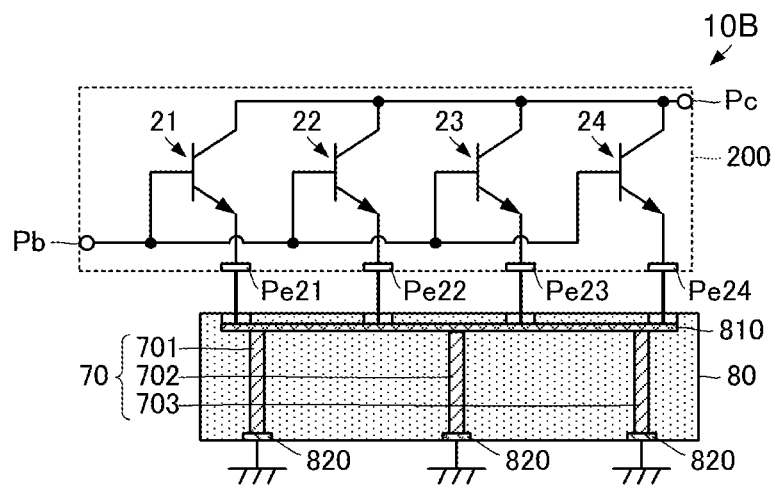
FIG. 4 is a diagram illustrating a schematic configuration of a high-frequency amplifier module according to a third embodiment of the present disclosure.

A high-frequency amplifier module according to a third embodiment of the present disclosure will be described with reference to the drawing. FIG. 4 is a diagram illustrating a schematic configuration of the high-frequency amplifier module according to the third embodiment of the present disclosure.

A high-frequency amplifier module 10B according to the third embodiment is different from the high-frequency amplifier module 10 according to the first embodiment in the position of the common ground electrode 810 in the insulating substrate 80. The other configuration of the high-frequency amplifier module 10B is substantially the same as that of the first embodiment, and portions that are substantially the same will not be described.

The common ground electrode 810 is disposed in a layer near the front surface of the insulating substrate 80. The expression "near the front surface" means a region in which the emitter electrodes Pe21, Pe22, Pe23, and Pe24 may be coupled to the common ground electrode 810 in the thickness direction of the insulating substrate 80 only through the conductive bonding material.

Such a configuration may also achieve substantially the same effects as those of the high-frequency amplifier module 10 according to the first embodiment.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A high-frequency amplifier module comprising:
   a semiconductor substrate including a plurality of high-frequency amplifying transistors, the plurality of high-frequency amplifying transistors amplifying a single high frequency signal; and
   an insulating substrate having a front surface and a back surface, the front surface facing the back surface, wherein the semiconductor substrate includes a plurality of emitter electrodes, each of the plurality of emitter electrodes being coupled to an emitter of a corresponding one of the plurality of high-frequency amplifying transistors, and wherein the insulating substrate includes
- a common ground electrode provided on or near the front surface and joined to the plurality of emitter electrodes,
- a ground terminal electrode provided on the back surface, and
- at least one thickness-direction coupling electrode coupling the common ground electrode to the ground terminal electrode.

2. The high-frequency amplifier module according to claim 1,
wherein the at least one thickness-direction coupling electrode includes a plurality of thickness-direction coupling electrodes.

3. The high-frequency amplifier module according to claim 1,
wherein an area of each of the plurality of emitter electrodes is larger than an area of a region having a corresponding one of the plurality of high-frequency amplifying transistors provided.

4. The high-frequency amplifier module according to claim 2,
wherein an area of each of the plurality of emitter electrodes is larger than an area of a region having a corresponding one of the plurality of high-frequency amplifying transistors provided.

* * * * *